United States Patent
Taylor

(10) Patent No.: US 9,520,900 B2
(45) Date of Patent: Dec. 13, 2016

(54) CONVOLUTIONAL INTERLEAVER HAVING A PLURALITY OF DELAY PORTIONS

(71) Applicant: SONY CORPORATION, Tokyo (JP)

(72) Inventor: Matthew Paul Athol Taylor, Ringwood (GB)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/780,223

(22) PCT Filed: Mar. 27, 2014

(86) PCT No.: PCT/GB2014/050975
§ 371 (c)(1),
(2) Date: Sep. 25, 2015

(87) PCT Pub. No.: WO2014/162111
PCT Pub. Date: Oct. 9, 2014

(65) Prior Publication Data
US 2016/0043739 A1    Feb. 11, 2016

(30) Foreign Application Priority Data

Apr. 2, 2013 (GB) .................................. 1305944.9

(51) Int. Cl.
*H03M 13/03* (2006.01)
*H03M 13/27* (2006.01)
(Continued)

(52) U.S. Cl.
CPC .......... *H03M 13/2732* (2013.01); *G06F 11/10* (2013.01); *H03M 13/2792* (2013.01);
(Continued)

(58) Field of Classification Search
CPC ................ H03M 13/2732; H03M 13/2782; H03M 13/2789; H03M 13/2792; H03M 13/2372; G06F 11/10
See application file for complete search history.

(56) References Cited

U.S. PATENT DOCUMENTS

| 6,151,690 A | 11/2000 | Peeters |
| 6,542,478 B1 * | 4/2003 | Park .................. H04B 1/707 370/308 |

(Continued)

FOREIGN PATENT DOCUMENTS

| EP | 0 856 949 | 8/1998 |
| EP | 0 892 501 | 1/1999 |

OTHER PUBLICATIONS

International Search Report Issued May 23, 2014 in PCT/GB2014/050975 filed Mar. 27, 2014.

(Continued)

*Primary Examiner* — David Ton
(74) *Attorney, Agent, or Firm* — Oblon, McClelland, Maier & Neustadt, L.L.P.

(57) ABSTRACT

A transmitter for transmitting a signal including an interleaved symbol stream includes a convolutional interleaver including a plurality of delay portions, each of which is arranged to delay symbols from an uninterleaved symbol stream from an input to an output by a different amount, the delay portions being arranged in a sequence. An input selector inputs the symbols from the uninterleaved symbol stream to the delay portions so that successive symbols are input in accordance with the sequence of the delay portions. An output selector reads the symbols from the delay portions by successively selecting the symbols from the outputs of the delay portions in accordance with the sequence of the delay portions to form an interleaved symbol stream.

12 Claims, 13 Drawing Sheets

(51) Int. Cl.
*G06F 11/10* (2006.01)
*H04L 1/00* (2006.01)
*H03M 13/00* (2006.01)

(52) U.S. Cl.
CPC ....... *H04L 1/0041* (2013.01); *H03M 13/2782* (2013.01); *H03M 13/2789* (2013.01); *H03M 13/6508* (2013.01)

(56) References Cited

U.S. PATENT DOCUMENTS

| | | | |
|---|---|---|---|
| 7,444,556 B2 | 10/2008 | Welborn et al. | |
| 7,549,093 B2 | 6/2009 | Heise | |
| 2006/0153308 A1 | 7/2006 | Xu et al. | |
| 2006/0153311 A1 | 7/2006 | Xue et al. | |
| 2008/0172593 A1* | 7/2008 | Rainish | H04N 19/89 714/776 |
| 2008/0276138 A1 | 11/2008 | Flynn et al. | |
| 2010/0189162 A1* | 7/2010 | Yoshimoto | H03M 13/27 375/141 |
| 2011/0113305 A1 | 5/2011 | Liu et al. | |
| 2013/0212328 A1 | 8/2013 | Liu et al. | |

OTHER PUBLICATIONS

Great Britain Search Report issued Sep. 19, 2013 in GB1305944.9 filed Apr. 2, 2013.
"VDSL2—Seamless Depth Change for the Generalized Convolutional Interleaver : HH-030", Texas Instruments, Inc., ITU-T Draft; Study Period 2005-2008, International Telecommunication Union, vol. 4/15, Jan. 17, 2005, pp. 1-12, XP017529077.
"G.VDSL: VDSL2 Seamless DRR using a Dynamic Interleaver", Alcatel Bell, ITU-T Draft: Study Period 2005-2008, International Telecommunication Union, vol. 4/15, Nov. 29, 2004, pp. 1-13, XP017524813.
U.S. Appl. No. 14/780,303, filed Sep. 25, 2015, Taylor.
Office Action mailed Oct. 16, 2015, in United Kingdom Patent Application No. GB1305944.9.

* cited by examiner

CONVOLUTIONAL INTERLEAVER HAVING A PLURALITY OF DELAY PORTIONS

FIELD OF THE DISCLOSURE

The present disclosure relates to transmitters and methods of transmitting signals that comprise an interleaved symbol stream.

BACKGROUND OF THE DISCLOSURE

In digital communication systems reliable communication of data is important and a number of methods exist to improve the reliability, such as error correction coding and data interleaving. Error correction coding allows errors in received data to be reliably corrected dependent on a number of errors in a code word being below a certain threshold. However, in the event of burst errors this threshold can be exceeded and the error correction code may fail to reliably correct the errors in the data. Interleaving of symbols and frames in a communication system assists in distributing burst errors between code words, therefore reducing the possibility that the error threshold of the error correction code will be exceeded. However, although interleaving is an important tool in modern communication systems, the benefits of interleaving often come at the cost of increased complexity and memory requirements at both a transmitter and a receiver.

SUMMARY OF THE DISCLOSURE

According to the present invention there is a transmitter for transmitting a signal comprising an interleaved symbol stream. The transmitter comprises a convolutional interleaver comprising a plurality of delay portions each of which is arranged to delay symbols from an uninterleaved symbol stream from an input to an output by a different amount, the delay portions being arranged in a sequence. An input selector is configured to input the symbols from the uninterleaved symbol stream to the delay portions so that successive symbols are input in accordance with the sequence of the delay portions. An output selector is configured to read the symbols from the delay portions by successively selecting the symbols from the outputs of the delay portions in accordance with the sequence of the delay portions to form an interleaved symbol stream. A controller is configured to detect a discontinuity in the uninterleaved symbol stream and to identify symbols from the symbol stream affected by the discontinuity, the identified symbols being symbols which follow the discontinuity in the uninterleaved symbol stream and would be read from the delay portions into the interleaved symbol stream or pushed out from the delay portions in response to the input of symbol from the symbol stream before symbols which precede the discontinuity in the uninterleaved symbol stream. The controller is also configured to store at least one of the identified symbols and to read the identified symbols into the interleaved symbol stream to compensate for the discontinuity, wherein at least one of the identified symbols is stored in one or more memories of a buffer.

The detection of discontinuities in the uninterleaved symbol stream, such as frame transitions, and the subsequent identification of symbols affected by the discontinuity allows discontinuities to be compensated for in a convolutional interleaver. The compensation enable a separation and a correct interleaving order to be maintained between frames without adversely affecting the latency of a system and without having to transmit dummy symbols which would reduce the capacity of a communications system. In order to compensate for the discontinuity and the effect it has on the interleaved symbol stream, affected symbols are identified and one or more of the identified symbols buffered in a small memory. These symbols are then later read back into the interleaved stream to restore the correctly interleaved sequence. This arrangement allows a convolutional interleaver to be reconfigured, interleaving frame lengths changed and interleaving frames separated whilst maintaining a constant latency through the deinterleaver. The present disclosure therefore provides a convolutional interleaver which maintains performance and memory advantages over a block interleaver whilst also allowing interleaving frames to be separated and other discontinuities to be compensated for.

Various aspects and features of the present invention are defined in the appended claims and include claims to a method of transmitting a signal comprising an interleaved symbol stream, a computer program for transmitting a signal comprising an interleaved symbol stream, and a data processing apparatus for processing a signal comprising an interleaved symbol stream.

BRIEF DESCRIPTION OF THE DRAWINGS

Embodiments of the present invention will now be described by way of example only with reference to the accompanying drawings where like parts are provided with corresponding reference numerals and in which.

DESCRIPTION OF EXAMPLE EMBODIMENTS

Figure 1:
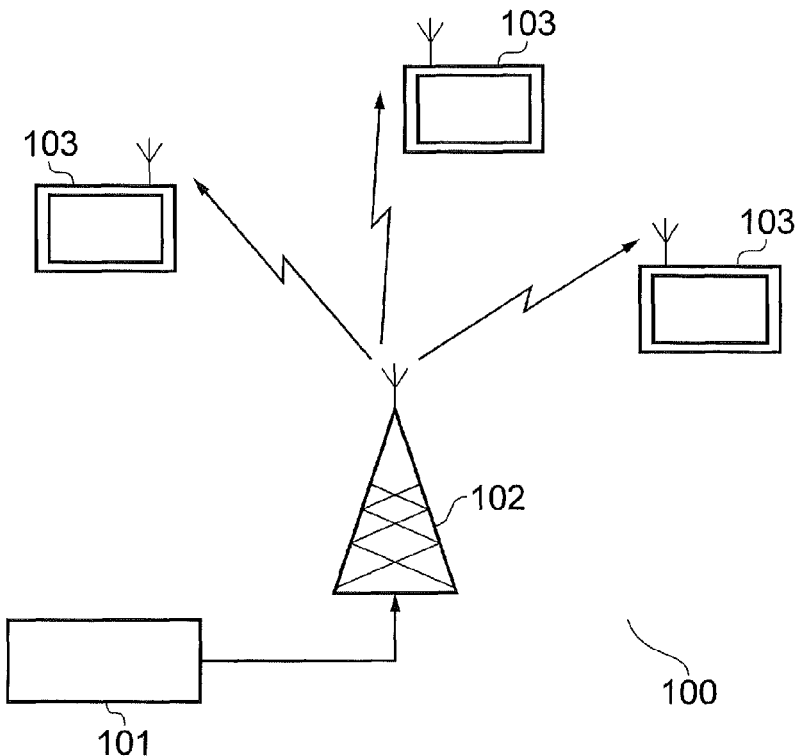
FIG. 1 provides a simplified diagram of a digital communication system.

FIG. 1 provides a block diagram of a simplified digital communication network 100. A network as illustrated by FIG. 1 may operate in accordance with any known communication standard such as the proposed ATSC 3.0 standard or DVB-T standard for example. A core network 101 transmits a signal, such as a digital audio-visual signal representing television content, to a transmitter 102 that transmits the signal. The transmitted signal is received by the receivers 103, which in the case of a digital audio-visual signal may be a television set or any other compatible device such as a mobile telephone. Although FIG. 1 shows the wireless transmission of a signal, the transmission of the signal may take place over cables in a cabled communication system such as those that operate in accordance with Cable or DVB-C.

Figure 2:
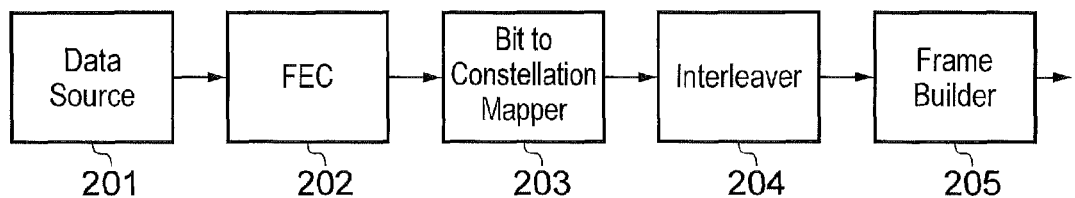
FIG. 2 provides a simplified block diagram of a transmitter suitable for use in the system of FIG. 1.

FIG. 2 shows a block diagram of example data processing elements which may form part of a transmitter chain of the core network 101 and the transmitter 102 of FIG. 1. In FIG. 2, the data source 201 generates data to be transmitted by the transmitter 102. The data source 201 feeds the data (possibly via intermediate elements) to a forward error correction (FEC) 202 encoder which performs error correction encoding of the data. The output of the forward error correction (FEC) encoder 202 may then be processed by other blocks, for example a constellation mapper 203, which maps groups of bits onto a constellation point, and is to be used for the conveying the encoded data bits. The outputs from the constellation mapper 203 are constellation points represented by real and imaginary components. The constellation points represent symbols formed from two or more bits depending on the modulation scheme used, which may be, for example, QPSK, QAM, 16QAM etc. The stream of symbols is then input to an interleaver 204 which may interleave the symbol across time and/or frequency. The interleaver 204 interleaves input symbols such that the symbols are distributed across one or more FEC code words, thereby creating a more uniform distribution of errors in cases where errors may occur in bursts in time or frequency. The interleaved symbols are received by a frame builder 205, which may form these symbols and symbols from other sources, which are used to convey information about the format of the transmission, into a set of symbols which will be referred to as a frame. However, in some examples the stream of symbols may have already been divided into frames or symbols allocated to frames prior to interleaving. A frame may then be processed by further blocks which modulate the frame onto for example a set of OFDM symbols, which are then used to modulate an RF signal for transmission over a radio channel or a cable channel. Although FIG. 2 depicts five elements, the core network 101 and transmitter 102 may also comprise a number of other elements common to the transmission of a digital signal, such as a multiplexer, a compression coder and signal amplifiers etc.

Figure 3:
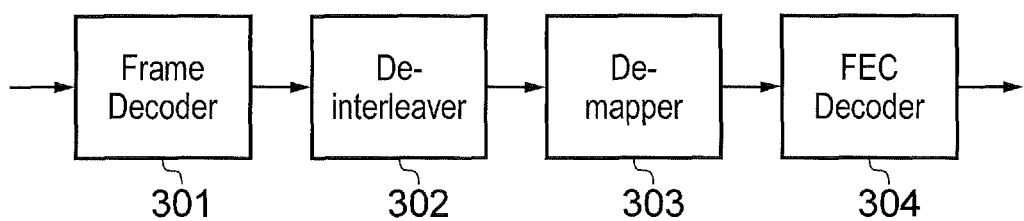
FIG. 3 provides a simplified block diagram of a receiver suitable for use in the system of FIG. 1.

FIG. 3 provides a block diagram of example data processing elements that may be comprised by the receivers 103 where the receivers 103 are operable to receive the signal transmitted by the transmitter 102 shown in FIGS. 1 and 2. The transmitted symbols are received by a frame decoder 301 via a suitable antenna and demodulation elements. The frame decoder 301 demultiplexes the frame and outputs a stream of interleaved symbols. These symbols are passed to a deinterleaver 302 which reverses the interleaving performed by the interleaver 204. The output of the deinterleaver then may pass through a demapper 303, which converts the symbols to a stream of bits. The data then passes to a FEC decoder 304 which attempts to correct any errors in the data. FIG. 3 illustrates a number of elements which may be found in a receiver such as those pictured in FIG. 1, however, the receiver 103 may also comprise a number intermediate block not shown in FIG. 3 such as a demodulator, signal amplifier and other data processing elements common to digital receivers.

Interleaving is often used in digital communication systems to improve the performance of forward error correcting codes. In many communication channels, errors often occur in bursts rather than in isolation or independently. If the number of errors within a code word exceeds the error-correcting code's capability, the error correction process may fail to recover the original code word. Interleaving ameliorates this problem by shuffling source symbols across several code words, thereby creating a more uniform distribution of errors. These code words are generally transmitted sequentially in time; hence the name "time-interleaving" because this stream of symbols is then interleaved in time. However, interleaving may also be done in the frequency domain so that in OFDM systems symbols may be distributed across different frequencies.

One method of performing interleaving is called block interleaving. This is used to implement the time-interleaving in many digital communication systems, for example DVB-T2 and ISDB-T. In a block interleaver blocks of symbols are interleaved and these blocks may be referred to as interleaving-frames. Another method of performing interleaving is convolutional interleaving. Convolutional interleaving is also known and used in digital communication systems, for example DVB-T. The advantage of a convolutional interleaver is that it generally uses half the amount of memory that is required for block interleaving, whilst giving similar performance. There are, however, disadvantages of convolutional interleaving when compared to block interleaving. For example, the data to be interleaved is continuous, rather than being divided into discrete interleaving frames. This means that it may not be possible to change the interleaver parameters whilst the interleaver or deinterleaver is running. Secondly, a size of a convolutional interleaver needs to be related to other parameters of the communication system in which it is operating so the deinterleaver at the receiver can be synchronised with the interleaver at the transmitter.

Figure 4:
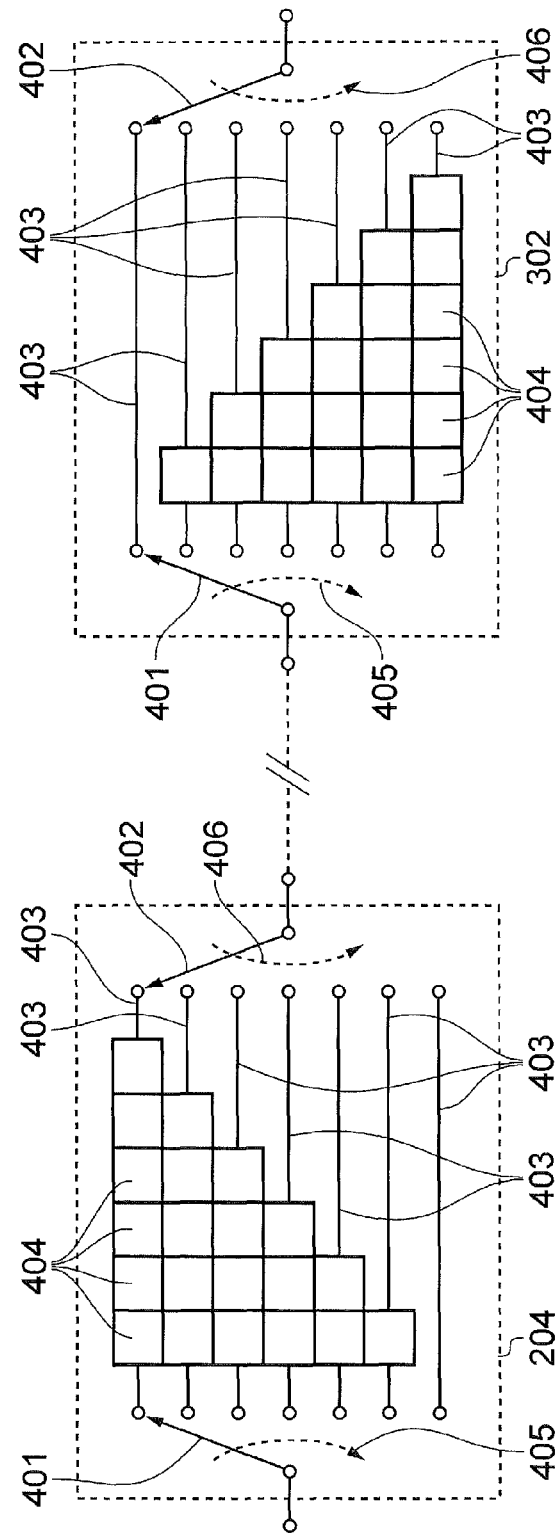
FIG. 4 provides schematic diagrams of an interleaver and deinterleaver pair suitable for use in the system of FIG. 1.

FIG. 4 illustrates the internal operation of a convolutional interleaver, such as the interleaver 204 depicted in FIG. 2, that would typically be found In the transmitter side of a digital communication system as depicted in FIG. 1. FIG. 4 also illustrates the internal operation of a convolutional deinterleaver, such as the deinterleaver 302 depicted in FIG. 3, that would typically be found In the receiver side of a digital communication system as depicted in FIG. 1. The interleaver 204 and the deinterleaver 302 each comprise an input selector 401, an output selector 402 and a plurality of delay portions 403, where the delay portions may also be referred to as interleaver/deinterleaver rows due to their layout in the interleaver and deinterleaver visualisations. The input selector 401 is operable to input symbols into a delay portion and the output selector 402 is operable to read out symbols from the delay portions. In some examples the input and output selectors 401, 402 may be synchronised such that they input and read out symbols from a same delay portion, however, they may also be unsynchronised such that they input and read out symbols from different delay portions. The selectors 401, 402 may for example become unsynchronised in the interleaver when output selector 402 does not read out a symbol from a delay portion but the input selector 401 continues to input a symbol to said delay portion.

The plurality of delay portions 403 are arranged to delay symbols by different amounts from when a symbol is input into a selected delay portion by the input selector 201 and read out from the selected delay portion by the output selector 402. At least one of the delay portions is made up of one or more memories or memory elements 404 where the delay introduced by a delay portion is partially dependent upon the number of memory elements the delay portion comprises. The number of symbols a delay portion is operable to store or delay at any one time is dependent on the number of memory elements the delay element comprises. In some examples the arrangement of the memory elements 404 may be said to form columns which are analogous to the interleaver/deinterleaver rows mentioned above. Each memory element may be associated with a memory location in an interleaver memory which is operable to store a symbol input into a delay portion. The delay portions 403 are arranged in a sequence such as that illustrated in FIG. 4, where the delay portions 403 in the interleaver 204 are arranged in an order corresponding to decreasing delay i.e. decreasing number memory elements, and the delay portions 403 in the deinterleaver 302 are arranged corresponding to increasing delay i.e. increasing number of memory elements. However, the sequence of delay portions 403 may be arranged in any sequence depending upon the interleaving pattern or sequence required. The input selector 204 is configured to input symbols from an input sequence in accordance with the sequence of the delay portions 403 as shown by the dashed line 405. Likewise, the output selector 402 is configured to read symbols from the delay portions in accordance with the sequence of the delay portions 403 as shown by the dashed lines 406 to form a deinterleaved symbol stream.

The input to the convolutional interleaver 204 may be a stream of bits, symbols, blocks of bits or symbols etc. The term symbol used throughout this description includes all these cases. Each symbol from a symbol stream is input by an input selector 401, the selectors advance one delay portion downwards after the input of a symbol, wrapping round back to the top after the bottom delay portion. Each time a symbol is read out of a delay portion 403 symbols remaining in the delay portions 403 are shifted towards the output selector 402 by one or more memory elements such that at least the memory element nearest to the input selector becomes vacant. During normal operation the next symbol from the interleaved or uninterleaved stream of symbols is input into the vacant memory element by the input selector 401. In the case of the delay portion which does not comprise any memory elements 404, the symbol input by the input selector 401 is immediately pushed out or read out by the output selector 402 before the selectors advance one delay portion downwards. Consequently, the delay between the input of a symbol from the stream of symbols into a delay portion and the output of the same symbol from the delay portion is dependent upon the number of memory elements 404 in the delay portion and the frequency that symbols are read out from the delay portion 403. Although in the description above the selectors 401, 402 move in a downward direction, they may also move in an upwards direction after the input and reading-out of symbols from each delay portion 403. In some examples, a symbol may be output or pushed out from a delay portion without the use of the output selector from a delay portion in response to the input of a symbol to the delay portion by the input selector 401. A symbol such as this may also not be read directly into the interleaved/deinterleaved symbol stream but instead stored in a memory. For instance, if the delay portions are implemented as shift registers or similar memory arrangements when a symbol is input to a delay portion the contents of the delay portion will be shifted toward the output and the last symbol in the delay portion pushed or shifted out without the use of the output selector. This pushed symbol may therefore not be read into the symbol stream. Likewise, the reading out of a symbol from a delay portion will result in the contents of the delay portion being shifted toward the output and the memory element nearest the input becoming vacant i.e. no longer containing useful data. Throughout this disclosure, the term "pushing out" of a symbol from a delay portion refers to the situation where the output selector is not involved, instead it is when a symbol is pushed out from a delay portion as a result of a symbol being input into the delay portion. Conversely, the "reading out" of symbol from a delay portion refers to when the output selector reads out a symbol from the delay portion into either the interleaved symbol stream or a separate memory. The term "output" describes both of these situations i.e. when a symbol is output from a delay portion either by pushing or reading.

As can be seen in FIG. 4, as a result of the different delays introduced by the delay portions 403 of the interleaver 204, the stream of symbols input into the interleaver 204 or deinterleaver 302 will be read-out in a different interleaved or deinterleaved order, respectively, which is dependent on the number of delay portions, the delay introduced by each delay portion, and the sequence of the delay portions. As can also be seen in FIG. 4, the deinterleaver 302 has a structure that corresponds to that of the interleaver 204 such that the interleaved symbols inputted into the deinterleaver are read-out in the uninterleaved order of the stream of symbols that were input into the interleaver at the transmitter. Although in FIG. 4 the interleaver 204 and the deinterleaver 302 are illustrated as comprising rows and columns of memory elements, convolutional interleaving may also be represented via other visualisations. For example, they may be represented via the use of matrices where the size of a matrix and its elements determine the delay and therefore the interleaving/deinterleaving of the input/output symbol stream. Furthermore, the elements of the interleaver and deinterleaver described above and throughout the application may be implemented on a multipurpose or dedicated processor chip, where the functionality of the interleaver and deinterleaver is equivalent to that described but the implementation differs from the visualisations that are illustrated and described. For instance, the delaying of symbols and the input and reading out of symbols may be performed via memory address manipulation as opposed to the physical transfer of data representing symbols.

In some digital communications systems it may be necessary to reconfigure the interleaving/deinterleaving process from time to time. If a block interleaver and deinterleaver are used, then this is straightforward because each interleaving frame is discrete and so the reconfiguration can be done in between interleaving frames. In order to reconfigure a convolutional interleaver or deinterleaver, however, it may necessary to shut down them down. In some other systems it may be desirable to shut the time-interleaver down at regular intervals, for instance, after every interleaving frame. If the interleaving/deinterleaving process is shut down, then either symbols would remain in the interleaver 204 and deinterleaver 302 delay portions 403 and memory elements 404, or some method is required to overcome the fact that some delay portions 403 in the interleaver 204 and deinterleaver 302 would contain symbols whilst others did not. It can also be seen that when restarting a interleaving/deinterleaving process after shutting down and reconfiguring the process, then either data that remained in the interleaver and deinterleaver delay portions and memories prior to shutting down would be lost or some method is required to overcome the fact that some delay portions in the interleaver and deinterleaver would contain symbols whilst others did not. Losing data will often be unacceptable and therefore a method is required to overcome the fact that some delay portions in the interleaver and deinterleaver would contain symbols whilst others do not.

A first technique to overcome the fact that some delay portions in the interleaver 204 and deinterleaver 302 would contain symbols whilst others do not is to insert dummy symbols into the interleaver whilst continuing the interleaving/deinterleaving process until all the real data has passed through both the interleaver 204 and deinterleaver 302. A disadvantage to this approach is that bandwidth across the communications channel is wasted by transmitting these dummy symbols.

A second technique to overcome the fact that some delay portions in the interleaver 204 and deinterleaver 302 would contain symbols whilst others do not, is for a controller within the interleaver or deinterleaver to configure the selectors 401, 402 to skip over delay portions which contain no valid symbols during current iteration so that either a symbol is not read out from, or a symbol is not input to a delay portion during the iteration. This skipping will result in symbols being punctured from the interleaved symbol stream and transmitted at a later time or input to the deinterleaver at a later time. Alternatively, it may be viewed that dummy symbols have been introduced and it is these that are punctured from the interleaved symbol stream. However, these dummy symbols would not be transmitted at a later time. In either case, bandwidth across the communications channel is not wasted because no dummy symbols are transmitted through it, and the symbol transmission rate is maintained because symbols are delayed rather than deleted. If the selectors 401, 402 skip over delay portions in response to symbol punctures or the need to puncture symbols, it is necessary for the interleaver 204 and deinterleaver 302 to be able to determine when it is necessary to do this. One method of doing this is for the interleaver 204 and deinterleaver 302 to store a flag to indicate whether each memory element 404 and its associated memory location contains valid or invalid data. A possible disadvantage of this is that extra memory is required to store this flag, which is a particular disadvantage in the receiver in a broadcast system because there will be many more receivers than transmitters and therefore the accumulated extra memory is significant. Similarly, the accumulated extra memory may also be significant in a two-way communication system where some or all of the devices in the system comprise transceivers. An alternative method is for the controller(s) to be able to calculate and detect when it is necessary for the selectors 401, 402 to skip over delay portions which contain no valid symbols or when there is no symbol which should be input into the delay portion at that time or iteration. For example, the controller may be configured to detect a discontinuity puncture in the interleaved symbols or a discontinuity in the symbols to be interleaved. After detection the controller can then identify symbols in the uninterleaved, interleaved or deinterleaved symbol stream which are affected by the discontinuity or discontinuity puncture. The aforementioned discontinuities will normally arise due to transitions between frames in the uninterleaved input symbol stream or when the interleaver and deinterleaver are required to be reconfigured and therefore the symbol stream separated into interleaving frames where symbols are not interleaved across the frames. The points at which the interleaver 204 or deinterleaver 302 skip whilst shutting down the interleaving/deinterleaving process i.e. just before a discontinuity such as a interleaving frame transition, will be referred to as shutdown punctures; the points at which the interleaver or deinterleaver skips whilst starting up the interleaving/deinterleaving process i.e. after a discontinuity such as a interleaving frame transition, will be referred to as startup punctures. Shutdown punctures may occur when a symbol stream is divided into interleaving frames and a symbol is not transmitted because it forms part of the next interleaving frame and it is required that all symbols from the current interleaving frame are transmitted prior to the transmission of the next interleaving frame. Similarly, a startup puncture may occur when two successive interleaving frames are transmitted separately i.e. not interleaved between each other, and the symbols in the interleaved stream that would belong to the preceding interleaving frame are not transmitted interleaved with the symbols from the subsequent interleaving frame. As mentioned above, punctured symbols are punctured from their normal position in the interleaved symbol stream and transmitted at a subsequent time. Consequently, even with puncturing, symbols are transmitted at the same rate and with the same latency but in an amended order to ensure separation between the symbols of two successive interleaving frames. It is the role of the controller in the interleaver to ensure the correct symbols are punctured to account for a discontinuity and the effects of the puncturing compensated for i.e. transmit at a later time those symbols which do not belong to the current interleaving frame. Correspondingly, it is the role of the controller in the deinterleaver to take account of or compensate for the amended order of transmission of the symbols when reconstructing the uninterleaved symbol stream.

Referring again to FIG. 4, in order to calculate when a delay portion 403 should be skipped over it is necessary to number the delay portions 403 sequentially and number the iterations of the selectors 401, 402 through the sequence of delay portions in the following manner $N_{por}=0,1,2 \ldots N_{pors}-1$ $N_{iter}=0,1,2 \ldots \infty$ where $N_{por}$ is the total number of delay portions 403 in the interleaver 204 or deinterleaver 302 and the number of symbols from the stream of symbols left in the current interleaving frame is $N_{frame}$.

Using the variables defined above it is possible to calculate a reference number, also known as the ordinal number, for each symbol which is input, pushed out, or read out from a delay portion and each memory element 404 of the interleaver 204 or deinterleaver 302. The reference numbers indicate the place of the symbol in the uninterleaved stream relative to the time that the startup process began, or the place of a symbol stored in a memory element in the deinterleaver symbol stream. When the selectors move in a downwards direction relative to the delay portions as shown in the Figures, the reference number may be given by $N_{ref}=(N_{iter}-N_{pors}+1)N_{pors}+(N_{pors}+1)N_{por}$.

The reference number is the position of the symbol in the uninterleaved symbol stream i.e. the position of symbol in the stream before interleaving or after deinterleaving, or the position of the symbol in a stream had it been stored in a particular memory element in the deinterleaver 302 or interleaver 204. Consequently, if a reference number is less than 0, then a startup puncture discontinuity has been detected because the symbol would belong to the preceding interleaving frames and the relevant selector(s) 401, 402 should move on to the next delay portion:

$N_{ref}<0$

If the reference number is greater than or equal to $N_{frame}$ then a shutdown puncture discontinuity has been detected because the symbol belongs to the subsequent interleaving frame and the relevant selector(s) 401, 402 should move on to the next delay portion:

$N_{ref} \geq N_{frame}$

In this way startup and shutdown punctures can be detected without having to store a flag for each memory location or element in order to indicate whether the symbol and or memory element is valid or invalid. In some examples the symbols and/or the memory elements may be allocated reference numbers and a discontinuity detected and compensation introduced when the reference numbers do not correspond to each other. In other examples the reference numbers of symbols may be compared to what should be expected during the current iteration and compensation introduced in the form of skipping the input or reading out of symbol from a delay portion(s) when a discrepancy between the reference numbers is detected. In yet another example, symbols affected by a discontinuity or puncture may be identified via a comparison between their reference number and those of other symbols in the uninterleaved or interleaved symbol stream. For instance, via a comparison between a symbol's reference number and the reference number of a symbol expected to be associated with a particular memory element in a selected delay portion. In some examples, if the reference number associated with a memory element from which a symbol is to be read out from, pushed out from, or input to is either $N_{ref}<0$ or $N_{ref} \geq N_{frame}$, then a puncture has been detected. Compensation is then introduced in the form of skipping the input or the reading out of a symbol to or from the delay portion(s) in which the memory element is located.

Whilst the interleaver 204 or deinterleaver 302 is running, a count of the number of symbols read out from the interleaver 204 or deinterleaver 302 can be maintained. Once this is equal to $$N_{frame} - 1$$

then all the symbols of the current frame have been read out.

Similarly, if the selectors 401, 402 move in the opposite direction i.e. an upwards direction relative to the delay portions in the Figures, a similar expression for $N_{ref}$ can be found:

$$N_{ref} = (N_{iter} - N_{por})N_{pors} + N_{por}$$

where the same expressions for detecting startup and shutdown punctures can be used.

In reality, we may wish to run the interleaver 204 or deinterleaver 302 for a long time, having started it before the time that it would be shut down was known. The technique described above can be used for this situation in order to detect the startup punctures, because it is not necessary to know the length of the interleaving frame $N_{frame}$ in order to detect startup punctures. However, the above technique needs to be adapted to enable shutdown punctures to be detected, given that the length of the interleaving frame $N_{frame}$ is not known. In this situation, we define some arbitrary time before the shutdown process has started and at which the selectors are at portion 0 ($N_{por}=0$). We define $N_{iter}$ to be 0 at this time and we define $N_{frame}$ to be the number of symbols remaining in the interleaving frame. Then the method described above can be used to detect the shutdown punctures. The value of $N_{frame}$ may be transmitted in signalling data which the deinterleaver can receive so that the deinterleaver can calculate the presence of shutdown punctures. This $N_{frame}$ signalling data may for example be transmitted at the start of a physical layer frame along with the selector synchronisation data described above.

As already stated, in some examples it may be necessary for the selectors in the interleaver 204 and the deinterleaver 302 to be synchronised. If the interleaver 204 has been started before the receiver 103 was switched on, then the receiver 103 needs to know the correct position of the selectors 401, 402. This may be achieved by the transmitter signalling the position of the selectors 401, 402 at the start of selected physical layer frames in some form of selector synchronisation data or signalling that appertains to the current interleaving frame. Then, during its acquisition process, the receiver 103 can decode that signalling in order to set the selector 401, 402 in the correct position. Once the deinterleaver 302 is synchronised with the interleaver 204, then this signalling does not need to be decoded.

It is also likely the receiver 103 needs to be able to synchronise to the output of the deinterleaver 302. For example, if the symbol stream were divided into FEC-frames for error correction purposes, the receiver 103 would need to be able to determine the position of the start of one of those FEC-frames. This may be done by the transmitter 102 signalling the number of symbols that the deinterleaver 302 will read out during that frame before some known reference point, for example the start of a FEC-frame, will be output from the deinterleaver 302.

It may be desirable that the latency of a communications system 100 is constant. For example, in a broadcast system, the original video or audio signal will be a continuous stream which needs to be output or displayed as such by a receiver 103. When the selectors 401, 402 of the interleaver 204 or deinterleaver 302 skip a delay portion 403 and therefore do not input and or read out symbols from a delay portion, other symbols will be affected and the rate of symbols input and output will vary. Consequently the latency through the system may be affected because a symbol expected to in the symbol stream has been punctured from the stream in order to be transmitted at a late time. Therefore, in many communications systems buffering of symbol(s) affected by a discontinuity puncture will be required in order to keep the latency constant and compensate for the effects of the discontinuity puncture.

In the interleaver 204, if a frame transition discontinuity is detected and a shutdown puncture determined, then the current symbol that is intended to be read out from the current delay portion is identified and may not be read out by the output selector 402 because the current delay portion is to be skipped. Instead a symbol from a subsequent delay portion will be read out. However, there will still be a symbol that is required to be input to the current delay portion. Therefore, the current symbol may be outputted in an alternative manner and stored somehow in a buffer. Likewise, in the deinterleaver 302, if a shutdown puncture is determined, then the current symbol from the interleaved symbol stream will not be input to the current delay portion and so this input data is required to be stored somehow in a buffer. This is particularly important because in many communications systems and particularly a broadcast system, the input data will be a continuous, unstoppable stream. In some examples the input symbols in the interleaver may be required to be stored depending on the input and reading out processes, and likewise in some examples the output symbols from the deinterleaver may be required to be stored depending on the input and reading out processes.

Interleaver

Figure 5:
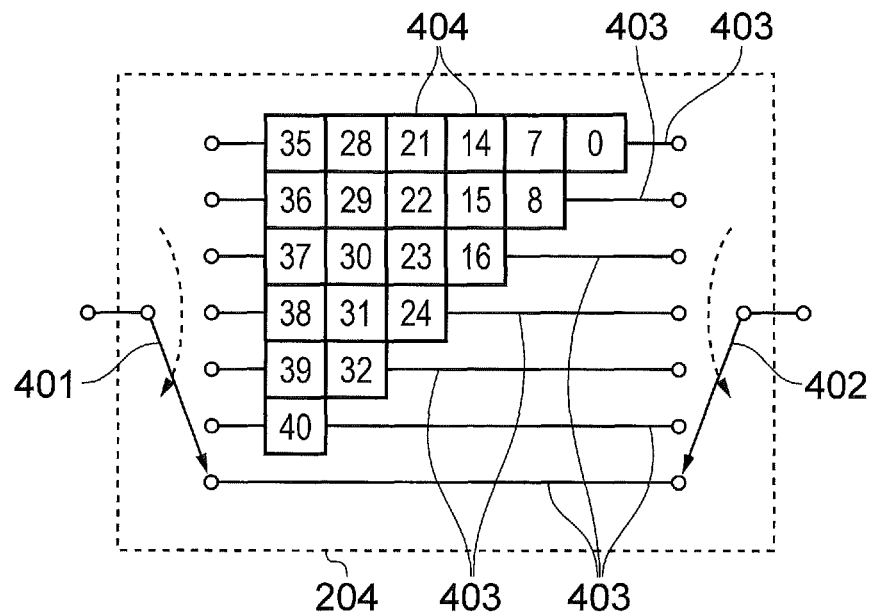
FIG. 5 to FIG. 7 provide schematic diagrams of an interleaver in accordance with an example of the present disclosure.

FIG. 5 shows an interleaver 204 on the last symbol of the current interleaving frame. The symbol in each memory element is numbered to indicate a reference number in the uninterleaved stream. In the example illustrated in FIG. 5, the symbol with reference number 41 is the last symbol of the input interleaving frame. The transition between interleaving frames may be seen as a discontinuity in the uninterleaved symbol stream and it is required that the symbols from the two successive interleaving frames are not interleaved with each other so that, for example, the size of the interleaver can be reconfigured.

Figure 6:
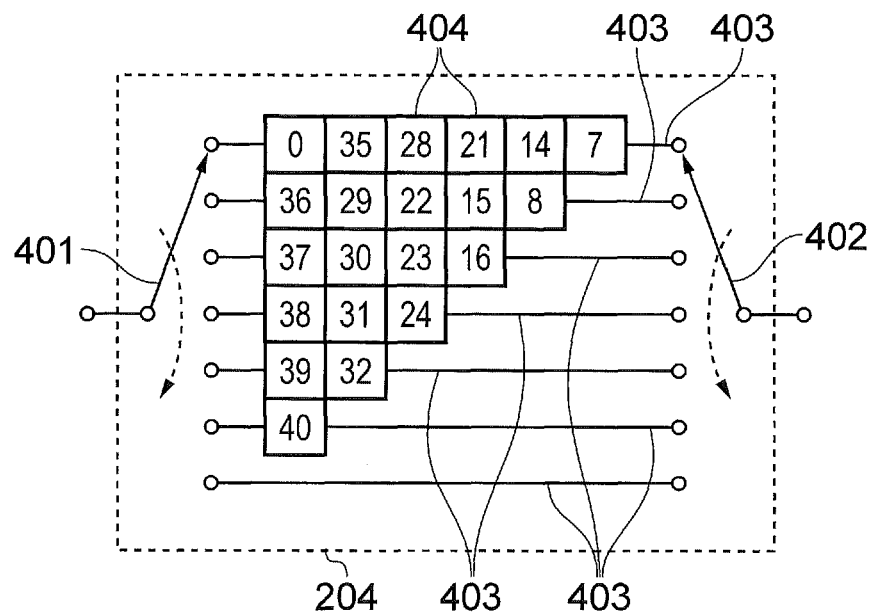

FIG. 6 shows the interleaver 204 one symbol later as the first symbol from the next interleaving frame is input. It can be seen that as the symbol is input, the top delay portion of the interleaver is shifted and the correct data is read out from the interleaver by the output selector 402.

Figure 7:
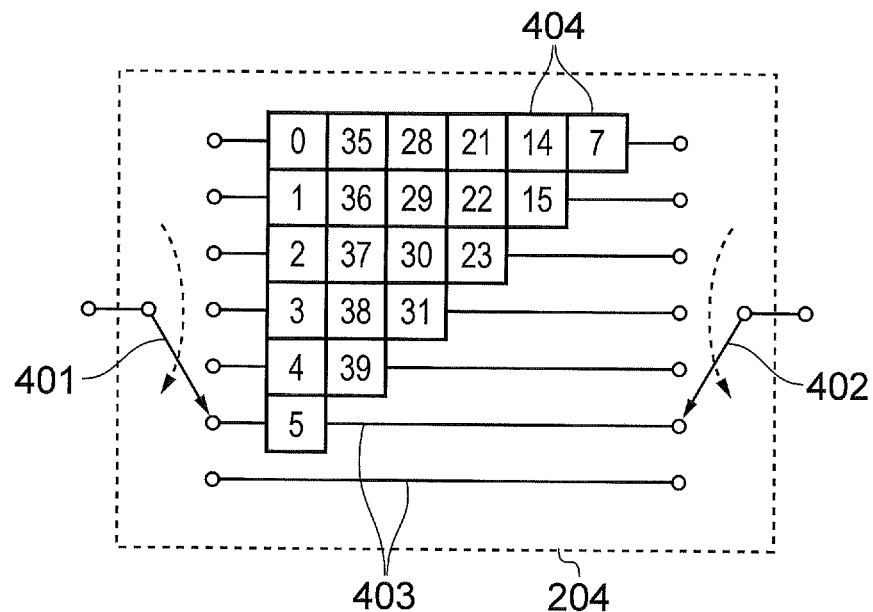

FIG. 7 shows the interleaver 204 as a shutdown puncture occurs and the affected symbols are identified. It can be seen that the symbol with index 6 is identified because it belongs to the next frame (i.e. $N_{ref}=N_{frame}+6$ and $N_{frame}+6>N_{frame}$). Therefore the symbol 6 should not be written or input to the bottom delay portion of the interleaver 204 or not read out from the bottom delay portion. If symbol 6 were to be read out during the current interleaving frame a separation between interleaving frames would not be achieved as there are still symbols from the current interleaving frame remaining in the interleaver memory. Consequently, given that the data rate into and out of the interleaver needs to be constant in order to give a constant latency and data capacity, the symbol with index 6 needs to be stored and symbol 7 read out instead. A first step to achieving this is that in response to detecting a discontinuity, the subsequent shutdown puncture and affected symbols are identified. The controller then configures the output selector to skip the bottom delay portion and move to the top delay portion because the identified symbol is associated with the bottom delay portion.

Figure 8:
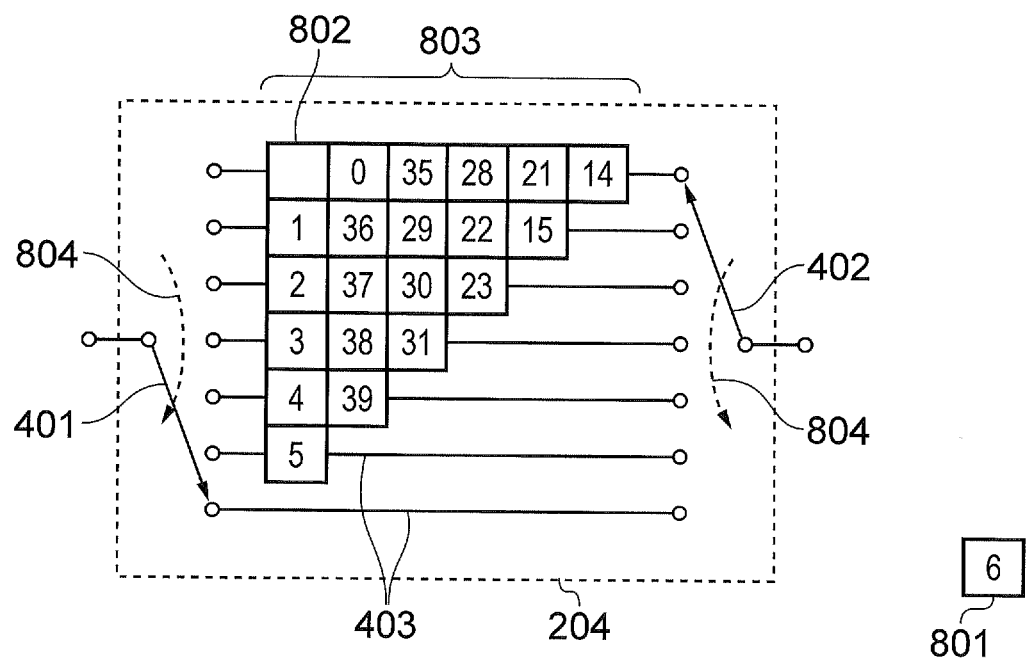
FIG. 8 to FIG. 15 provide schematic diagrams of an interleaver with a parallel buffer in accordance with an embodiment of the present disclosure.

FIG. 8 illustrates a technique to store the input symbol. In FIG. 8 a buffer 801 in parallel to the interleaver 204 is used to store the symbol 6 as a shutdown puncture occurs. Here the buffer 801 is represented by a new memory location, which contains the symbol with index 6. The symbol 6 may either be input directly into the parallel buffer 801 before being input to the delay portions or, in the case it has been input into the delay portion, pushed out into the parallel buffer 801. As each shutdown puncture occurs, the number of symbols stored in the buffer 801 will increase. A disadvantage of this method is that extra memory in addition to the existing interleaver memory is required to implement the buffer 801. In order to reduce the impact of this disadvantage, it is advantageous to limit the amount of memory required to implement this input buffer 801.

A first approach to limiting the amount of memory required to implement the input buffer 801 is to reuse the interleaver memory to implement the buffer 801. Referring again to FIG. 8, it can be seen that a memory location 802 in the top delay portion 803 becomes unoccupied as the shutdown puncture occurs because symbol 7 has been read out and the contents of the delay portion shifted but no symbol has been input to the delay portion. It turns out that each time a shutdown puncture occurs a memory element becomes unoccupied and therefore the memory location corresponding to the unoccupied memory elements can be used to implement the buffer.

The shutdown puncture process may also be viewed in an alternative manner. For example, if the symbols from the next interleaving frame are viewed as being stored instead of input to the delay portions, it turns out that no more symbols will be written to the top delay portion 803 during the current interleaving frame and therefore the leftmost memory location 802 in the top delay portion is no longer required during this interleaving frame. This can be shown by considering the expression for the reference number $N_{ref}$ for the interleaver 204 with the selectors 401, 402 moving in a downward direction as indicated by the dashed line 804.

$$N_{ref}=(N_{iter}-N_{pors}+1)N_{pors}+(N_{pors}+1)N_{por}$$

The shutdown puncture is determined because the reference number $N_{ref}$ associated with the symbol or the memory element in which a symbol will be placed is greater than the length or remaining length of the interleaving frame $N_{frame}$. It can be seen that for a fixed $N_{por}$ (e.g. the top delay portion 803 in this case) and a fixed $N_{pors}$, on the next iteration $N_{iter}$ will have increased by 1 and so the value of $N_{ref}$ will necessarily be greater than on the current iteration. Thus a shutdown puncture will necessarily be determined for this delay portion 803 on the next iteration and all subsequent iterations because $N_{iter}$ always increases. The symbols from the next interleaving may in some examples be viewed as being stored separately to the identified symbols which are pushed out and stored in the buffer. This separate storage may also be formed from the unoccupied memory elements of the interleaver and therefore no extra memory is required. However, as explained below, if the inputting of symbols in the delay portions continues as if the discontinuity had not occurred it turns out that only a minor rearrangement of the symbols in the interleaver from the next interleaver frame is required when the interleaver is configured to the next interleaving frame.

As mentioned above and as can be seen in FIG. 8, whenever a shutdown puncture is determined and a delay portion skipped, a memory element and corresponding memory location becomes no longer required in the interleaver 204. Therefore, whenever a shutdown puncture is determined and a memory location becomes unoccupied and no longer required, that memory location could be used to implement the buffer 801 to store an input symbol that was not input to a particular delay portion.

However, reusing this memory location as a parallel buffer 801 may lead to increased complexity. Instead, in some embodiments it may be advantageous to implement the parallel buffer 801 using a separate memory.

It can also be seen in FIG. 8 that the selectors 401, 402 are no longer selecting the same delay portion as each other and are therefore no longer completely synchronised. The selector 402 at the interleaver output skips the bottom delay portion because a shutdown puncture has been detected and the affected symbols identified, whereas the selector at the input 401 does not skip the bottom delay portion. However, as the sequence progresses, it will be seen that it is advantageous that the input selector behaves in this manner.

Figure 9:
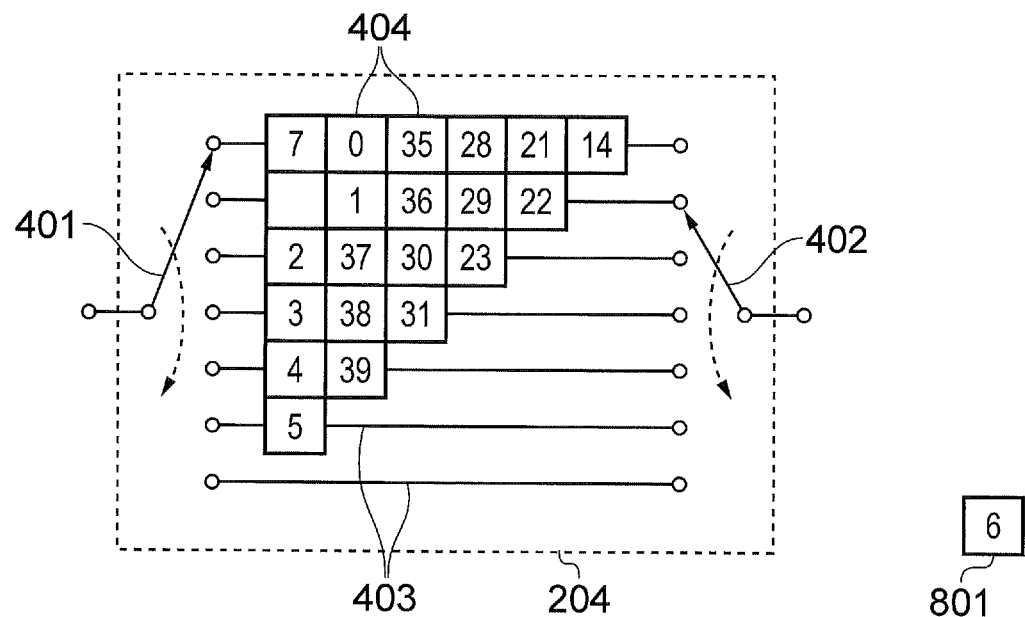

FIG. 9 shows the interleaver one symbol later when compared to FIG. 8. In FIG. 9 both selectors 401, 402 have advanced one delay portion and so remain inputting and reading out from different delay portion to each other. The output selector 402 points to the second delay portion and the last symbol is read out from the second delay portion. The input selector 401 points to the top delay portion and so a symbol is input to the top delay portion. Therefore, as symbols can be input to and read out from different delay portions, rather than being implemented as shift-registers as conventional convolutional interleaver may utilise, the delay portions in the interleaver 204 are first-in first-out (FIFO) memory arrangements.

Figure 10:
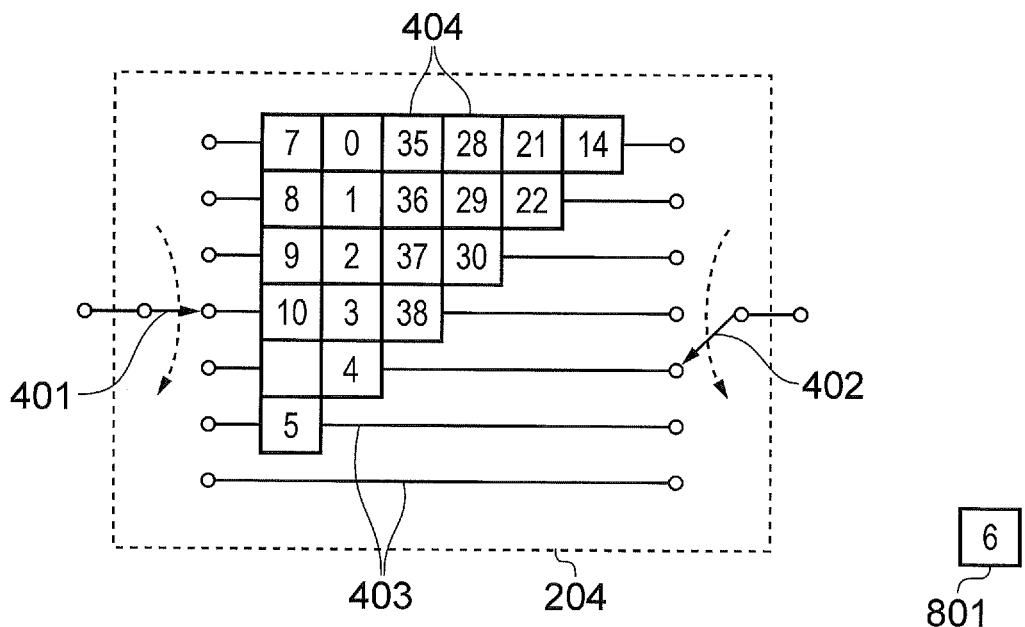

FIG. 10 shows the interleaver 204 one symbol before a second shutdown puncture occurs. It can be seen that the selectors 401, 402 have advanced one delay portion per symbol and sequential symbols from the uninterleaved symbol stream have been written to each delay portion in accordance with the sequence of the delay portions 403.

Figure 11:
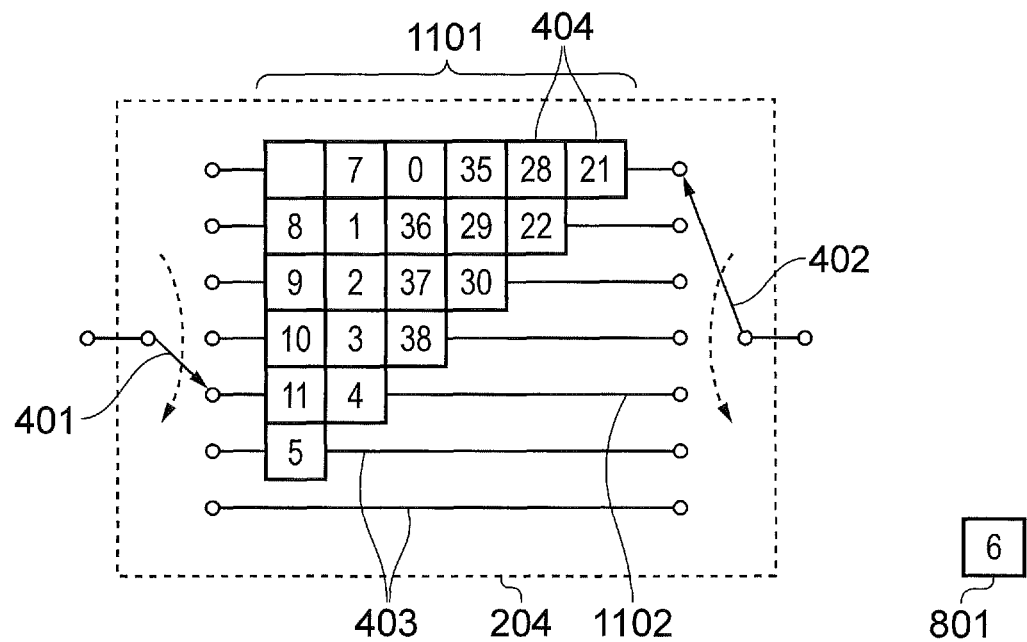

FIG. 11 shows the interleaver 204 as the second shutdown puncture occurs. Because of the shutdown puncture, the output selector 402 has advanced one more delay portion relative to the input selector 401. A symbol is read out from the top delay portion 1101 and a symbol input to the fifth delay portion 1102. In FIG. 11, it can be seen that the next symbol to be read out is the symbol with reference number 5, however, this symbol follows the discontinuity of a transition between the current interleaving frame and the next interleaving frame in the uninterleaved symbols sequence, therefore the symbol belongs to the next interleaving frame. Consequently, this symbol should not be read out from the interleaver at this iteration because there are still symbols from the current interleaving frame remaining in the delay portions i.e. symbols that precede the discontinuity in the uninterleaved symbol stream. Therefore, to avoid this and ensure a separation between the interleaving of the symbols from the current and the next interleaving frames, the symbol from the next interleaving frame with reference number 5 needs to be stored in the parallel buffer 801.

Figure 12:
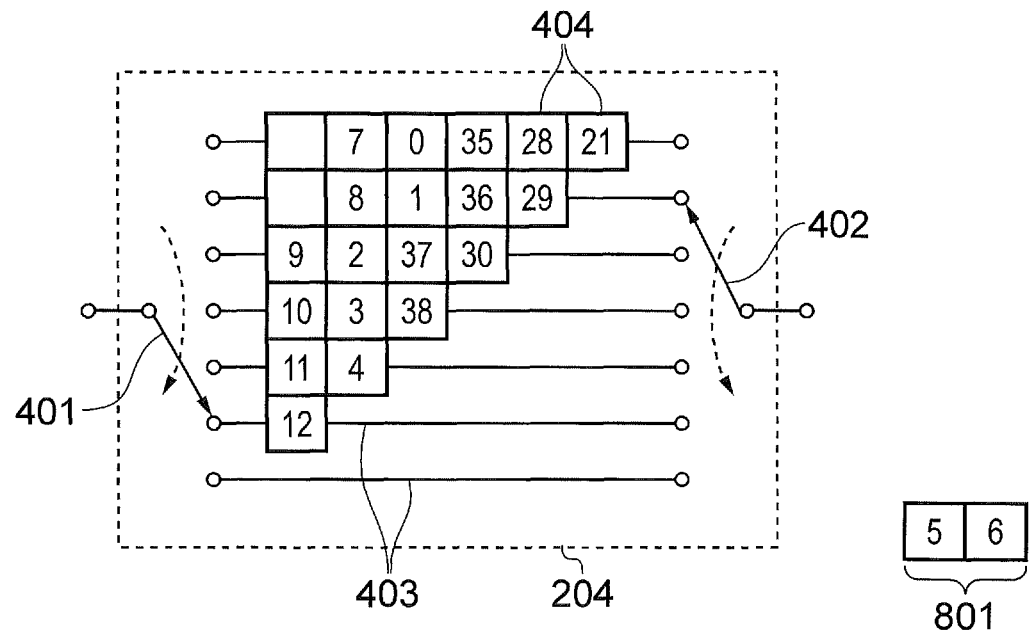

FIG. 12 illustrates the storing of the symbol 5, which belongs to the next interleaving frame, as described above. Also in FIG. 12 a memory element in the second delay portion becomes unoccupied due to the reading out of the symbol with reference number 22 and a shifting of the symbols remaining in the second delay portion. Once again it can be seen that the parallel buffer 801 stores a number of symbols which is equal to free memory elements of the delay portions 403.

Figure 13:
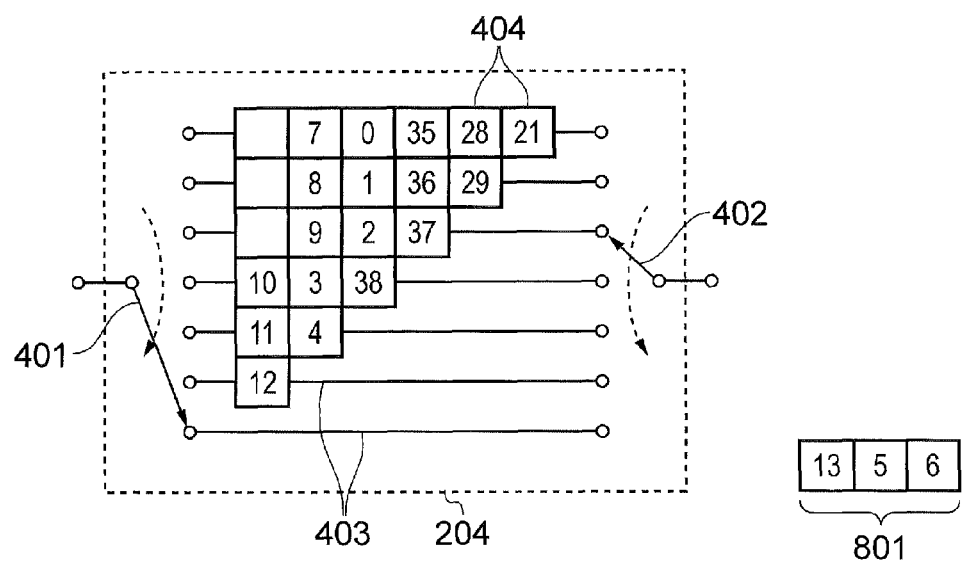

FIG. 13 illustrates the interleaver 204 one symbol after a third shutdown puncture. It is evident that the input symbol with reference 13 should not be read out from the interleaver 204 and instead should be stored in the parallel buffer 801 either before it is input to the bottom delay portion or by outputting by a different means directly into the parallel buffer 801.

The aforementioned behaviour continues until all the symbols from the current interleaving frame i.e. symbols whose place in the uninterleaved symbol stream is prior to the discontinuity, have been read out from the delay portions 403 and the associated interleaver memory.

Figure 14:
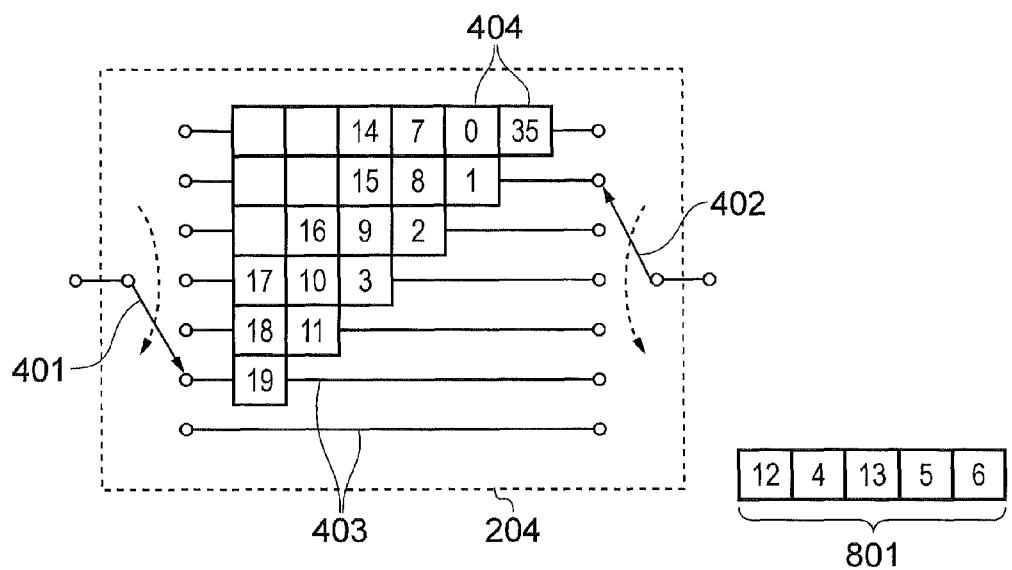

FIG. 14 illustrates the interleaver 204 one symbol before the final symbol in the current frame is read out from the deinterleaver by the output selector 402. It can be seen that on the next iteration, the symbol from the next interleaving frame with reference 20 will be input to the bottom delay portion but, rather than being read out into the interleaved symbol stream, this needs to be output to the parallel buffer 801 because there is still a symbol from the current frame remaining in the interleaver. During this input/read cycle the output selector 402 will read out the final symbol 35 from the current frame i.e. the final symbol in the uninterleaved stream before the discontinuity.

Figure 15:
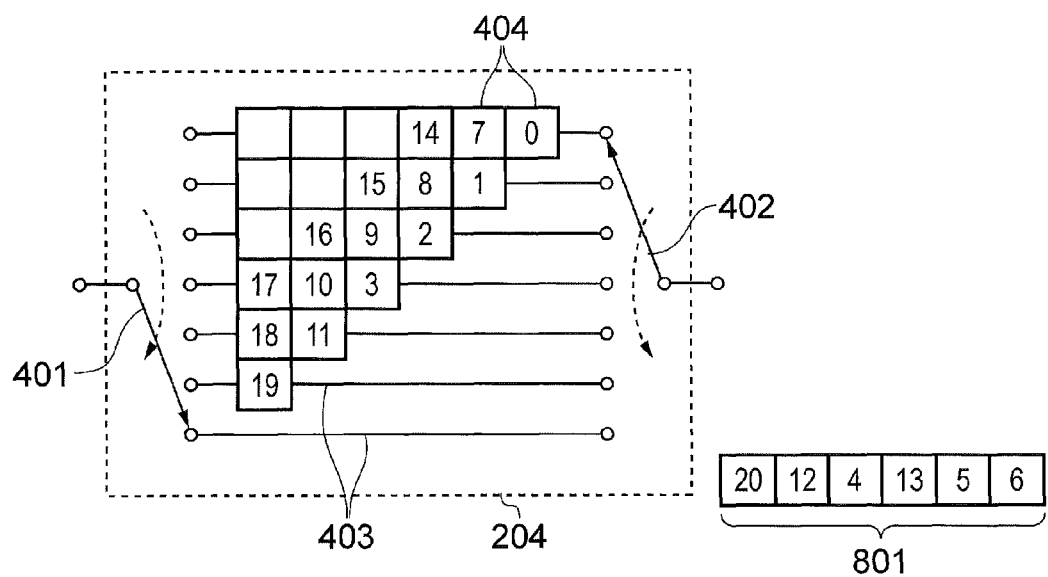

FIG. 15 shows the interleaver 204 as the last symbol from the current interleaving frame prior to the discontinuity is read out. It can be seen that the number of free memory elements 404 and associated memory locations in the interleaver 204 is equal to the number of symbols in the parallel buffer 801. As previously mentioned, it is desirable to limit the amount of memory used by the parallel buffer 801 because the principle advantage of a convolutional interleaver is that it requires less memory than a block interleaver whilst achieving a similar performance. This may be accomplished by using the free memory elements and locations in the interleaver 204 to implement the parallel buffer 801, however, this may be computationally complex. Consequently, it is important to determine the maximum size of the parallel buffer 801 so that the free memory can be managed correctly and efficiently.

Figure 16:
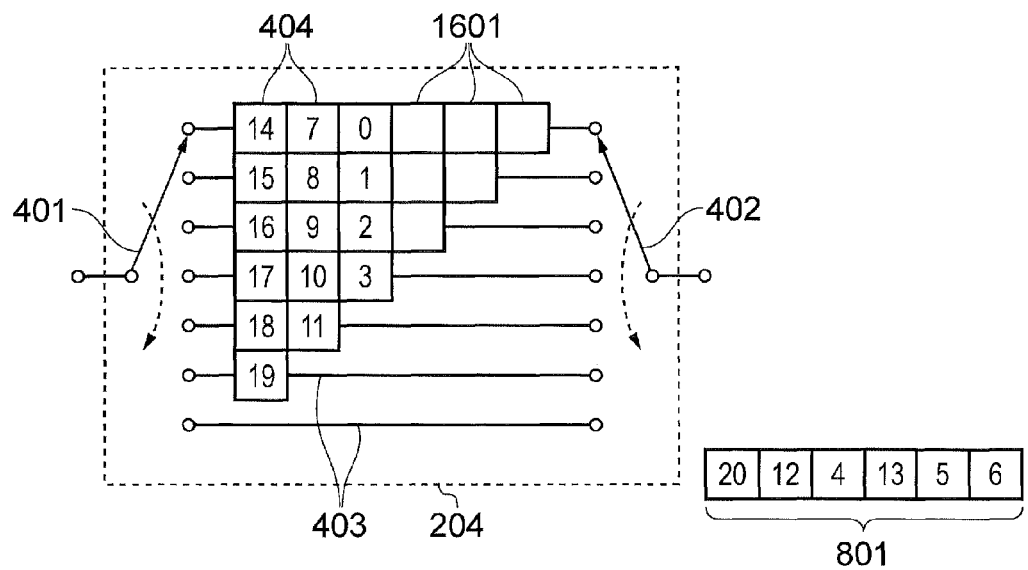
FIG. 16 to FIG. 21 provide schematic diagrams of an interleaver in accordance with an example of the present disclosure.

FIG. 16 illustrates the restarting of the interleaver 204 after a discontinuity. In one example of the present technique, restarting of the interleaver 204 may be achieved using simple memory address decoding rather than by the physical moving of data, in fact if each delay portion is implemented using a FIFO, simply swapping read and write pointers is sufficient. In FIG. 16 the symbols remaining in the delay portions are redistributed such that they occupy the memory elements 404 of the delay portions 403 nearest to the input to the delay portions 403. Once reconfiguration has been completed startup punctures will occur as result of the unoccupied memory elements 1601 in the delay portions 403. A startup puncture will occur on the first symbol of the frame and there will be the same number of startup punctures as there are memory locations in the parallel buffer 801.

In a case where the interleaver were started afresh with no data already stored in the memory, the reference number of the first symbol read out would be 6 as that is the index of the symbol that would be input first to the bottom delay portion. Likewise, the reference number of the second symbol read out would be 5 as that symbol would have been stored in the penultimate delay portion on the first iteration of the input selector 401 and so this would be read out first on the second iteration. It can be seen that the reference number of the third symbol to be read out would be 13 and so on. Therefore, on examination of the contents of the parallel buffer 801, it can be seen that the parallel buffer 801 actually contains the symbols of the interleaved symbol stream for the next or new interleaving frame in the correct interleaved order.

Figure 17:
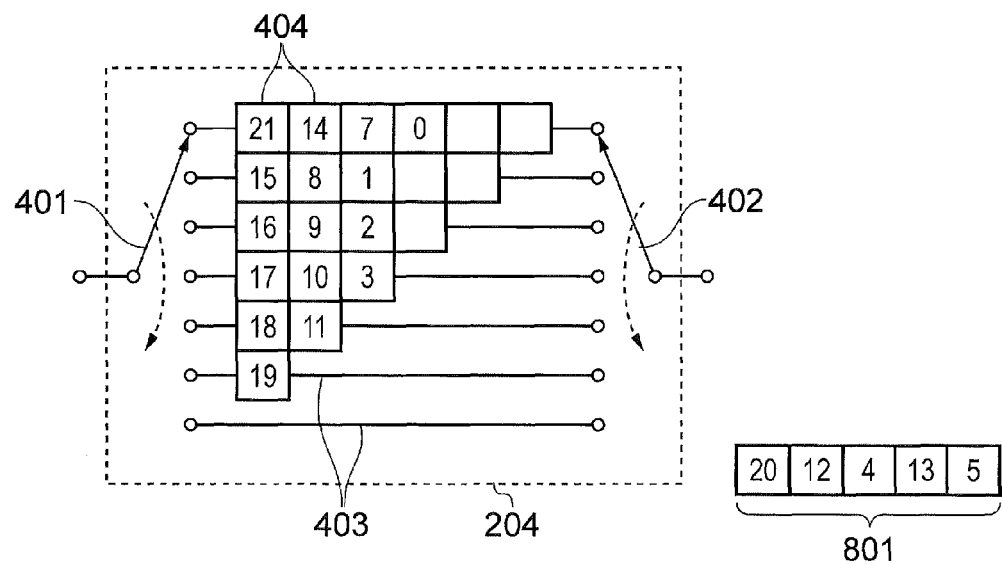

FIG. 17 shows the interleaver after the first symbol of the next interleaving frame has been read out. As a result of there being no symbol to read out from the top delay portion a startup puncture occurs. Consequently, in order to maintain a constant latency through the interleaver, data is read out from the parallel buffer 801. In the example shown in FIG. 30, this process will also occur for the next two symbols therefore resulting in the parallel buffer 801 being reduced in length by three symbols.

Figure 18:
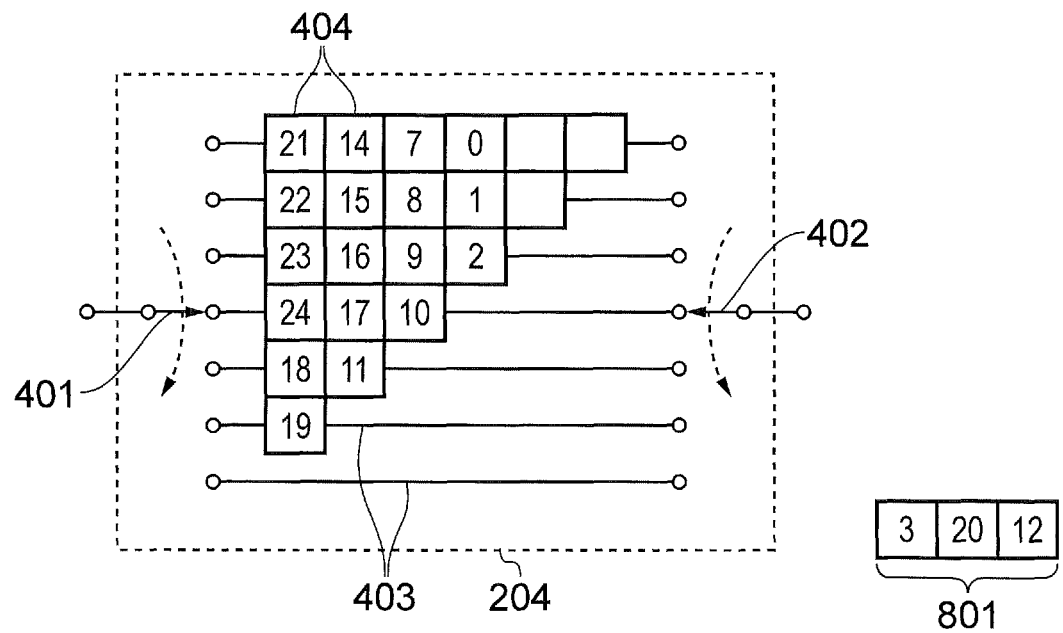

FIG. 18 shows the interleaver as the next symbol is input from the uninterleaved symbol stream. There is now no startup puncture and so a symbol with reference 3 is selected by the output selector 402. However, as already mentioned, the parallel buffer 801 contains the first six symbols of the interleaved symbol stream so the symbol with index 3 should not be read out from the interleaver 204 by the output selector 402. Instead, the next symbol (with index 4) from the parallel buffer 801 is read out and the symbol with index 3 is stored in the parallel buffer 801. Thus, the parallel buffer 801 operates as a FIFO, which stores symbols read out from the interleaving memory when the buffer contains stored symbols and reduces in length by one symbol every time a startup puncture occurs.

Figure 19:
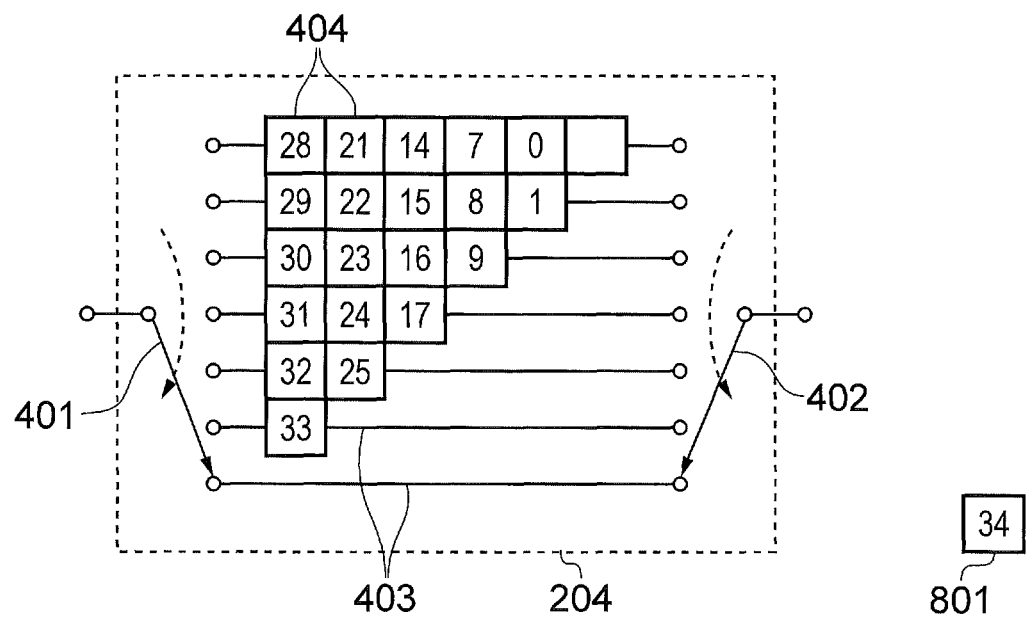

FIG. 19 shows the interleaver 204 just before the last startup puncture occurs. The last remaining symbol in the parallel buffer 801 will be read into the interleaved symbol stream and once this is done the interleaver continues running as a conventional convolutional interleaver as previously described until it is required to shut down.

Reconfiguration

In some circumstances the interleaver 204 and deinterleaver 302 may be required to be shut down and then restarted in order for reconfiguration to take place. Reconfiguration may be required because the size of the interleaver and deinterleaver is to be changed, for example, the number of delay portions $N_{pors}$ may be required to be increased or decreased in order to adjust the interleaving depth and sequence. As mentioned previously, the transition between interleaving frames or the requirement of reconfiguration may be interpreted as a discontinuity and therefore may lead to the storage of symbols dependent on their place in the uninterleaved symbol stream is relative to the discontinuity. If the number of delay portions is not changed, then no reconfiguration is required and the technique previously set out can be used. However, if the size of any interleaver 204 and deinterleaver 302 is changed then there will necessarily be a change in the latency through them and therefore the techniques previously described may not be suitable. Instead some other mechanism such as there being gaps in the transmitted data or there being a data smoothing buffer in the receiver is required.

Figure 20:
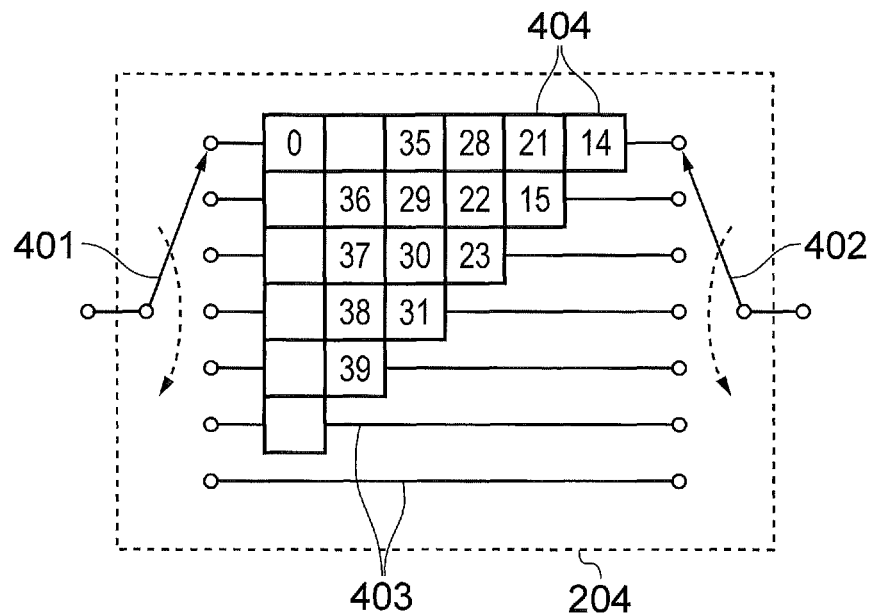

If the size of the interleaver 204 is increased then one or more columns of memory elements nearer to the interleaver 204 input selector 401 are added and then the technique described for compensating for shutdown punctures or discontinuities can be followed. FIG. 20 shows an example interleaver 204 where an additional column of memory has been added. It can be seen that there will be a gap of one or more columns in the interleaver 204, which will lead to a gap in the interleaver output. This may be unavoidable if the interleaving frame size is to be increased, however, this gap must be resolved elsewhere in the system, for example by downstream buffering or by multiplexing other data into the data stream at some point in the communication system.

Figure 21:
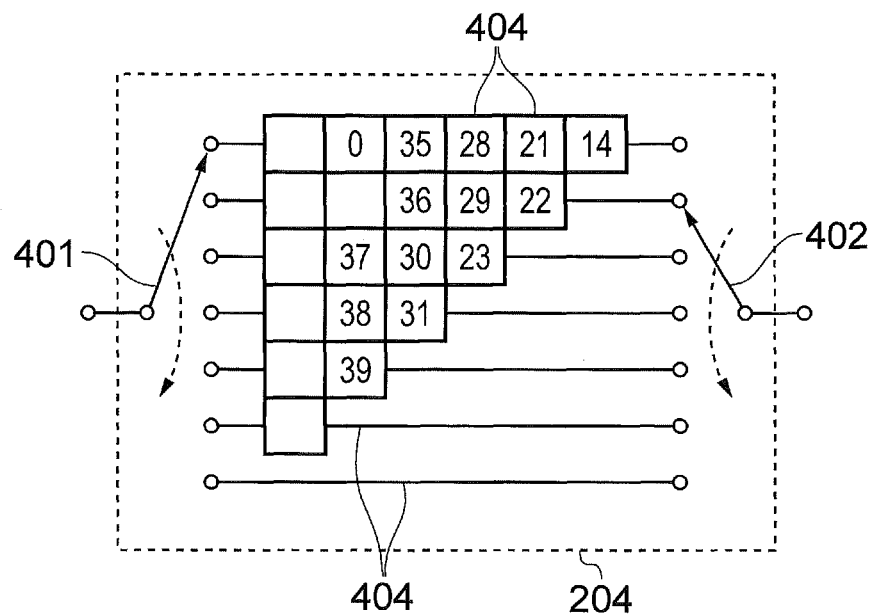

FIG. 21 shows an example of an interleaver 204 where the size of the interleaver is to be reduced. In the example of FIG. 21 the approach previously described may be followed except that symbols should not be input to the delay portions until the necessary number of columns of memory elements closest to the interleaver input selector 401 have been emptied and are thus unoccupied. Any remaining data must either be buffered upstream from the deinterleaver 302 or could be buffered by using the remaining and now unused memory locations associated with the unused memory elements as a buffer. A buffer such as this may for example be implemented using a circular buffer or a FIFO utilising the vacant memory locations so that no further memory is required in the interleaver.

Memory Management

It is likely that the memory for the interleaver 204 would be implemented as part of a random access memory rather than as discrete memory locations such as flip-flops. In that case, rather than physically moving data between memory locations in the random access memory, it would be better to move the data virtually by controlling the address mapping. In that case, the following memory mapping function $f_a$ is required for the interleaver $$A_{RAM} = f_a(N_{por}, N_{column})$$

where $A_{RAM}$ is the address in the random access memory
$N_{por}$ is the delay portion number
$N_{column}$ is the column number The function $f_a$ is commonly known in the art because convolutional interleaving/deinterleaving is a known technique and so techniques for implementing such interleavers in a random access memory are commonly known.

Each delay portion 403 in the interleaver 204 is effectively a shift register where a symbol is shifted out the last memory element 404 of each delay element 403 at each iteration. If the interleaver 204 is implemented using, for example, flip-flops, then implementation of a shift register is well-known. However, if the interleaver 204 is implemented using a random access memory it is convenient to implement each delay portion as a ring buffer. A ring buffer is a known technique, in which a shift register is implemented using a fixed block of memory of the same length as the shift register. A pointer is then maintained and the shifting of the shift register is simulated by first reading the data pointed to (which becomes the output of the shift register i.e. the a delay portion), then writing data to the same location (which is the input data to the shift register i.e. delay portion), then moving the pointer to point to the next memory location whilst wrapping round to the first memory location if the pointer should be incremented beyond the end of the block of memory.

Figure 22:
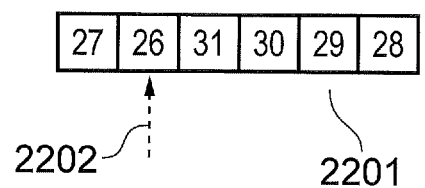
FIG. 22 provides a schematic diagram of a circular buffer in accordance with an example of the present disclosure.

FIG. 22 illustrates a circular buffer 2201. A pointer 2202 points to the memory location containing the symbol with index 26; when the next symbol arrives the symbol with index 26 would be read from the memory location pointed to by the pointer 2202, the new symbol written to that same memory location and then the pointer 2202 incremented so that it points to the memory location which contains the symbol with index 27. Thus the next output from the circular buffer 2201 will be the symbol with index 27 and the symbol that was written to the memory location pointed to in FIG. 22 would be output after five further read/write cycles. Thus, it can be seen that the circular buffer 2201 is implementing a shift register without data having to be physically shifted between memory locations. The pointer 2202 can be mapped to the linear random access memory address space using a function such as $f_a(N_{por}, N_{column})$.

In FIG. 16 the interleaver 204 is shown as the last symbol from the current interleaving frame is read out. It can be seen that the number of free memory elements 404 and associated memory locations in the interleaver 204 is equal to the number in the parallel buffer 801. As mentioned previously, it is desirable to limit the amount of memory used by the parallel buffer 801 because an advantage of a convolutional interleaver is that it requires less memory than a block interleaver with similar performance. If a buffer equal in size to the interleaver were used to store all the symbols from the next interleaver frame the interleaver would utilise the same amount of memory as a block interleaver and therefore the memory advantages of the convolutional interleaver would be lost. Limitation of memory usage can be achieved by using the unoccupied interleaver memory elements and locations to implement the parallel buffer 801, but this may be computationally complex because the buffer acts a FIFO and not all the memory location required by the FIFO would be available at any one time. Consequently, it may be beneficial to implement the buffer 801 using a dedicated buffer memory. However, if this is to be done it is important to determine the maximum size of the parallel buffer 801 so that memory requirements are known a priori and the buffer can be effectively and efficiently implemented.

If a restriction in accordance with $$N_{frame} \bmod N_{pors} = 0$$

is placed on the size of the interleaving frame and the interleaver, the maximum size of the parallel buffer can be calculated using the expression below. The size of the buffer is a determined by the number of shutdown punctures that occur before the end of the current interleaving frame:

$$N_{max} = \sum_{k=1}^{floor\left(\frac{N_{pors}}{2}\right)} k, \cong N_{addr}/4 \text{ for large } N_{pors}$$

where $N_{max}$—maximum length of the parallel buffer
$N_{pors}$—number of delay portions in the interleaver
$N_{addr}$—number of memory locations in the interleaver Having regard to the calculation of $N_{max}$, it can be seen that if a conventional convolutional interleaver utilises approximately 50% of the memory of a block interleaver, a convolutional interleaver operating with a buffer in accordance with an example of the present disclosure would utilise approximately 62.5% of the memory of a block interleaver (50%+50%/4). Consequently, the memory efficiency of a convolutional interleaver can be maintained whilst achieving the flexibility of a block interleaver with regards to interleaving frame separation.

Various modifications may be made to embodiments herein before described. For example other memory management techniques may be used to implement the interleaver, the delay portions and memory elements, and the parallel buffer. The functional elements of the interleaver herein before described may also implemented using a variety of means, for instance the controller and memory management elements may be implemented as circuitry, circuits, parts of circuits, logic, processors or parts of processors. Similarly, the blocks of the transmitter and the receiver, the delay portions, memory elements, memory locations and section of the input buffer may be implemented using a variety of means for example, such as through a combination of volatile and non-volatile memory, circuitry, circuits or parts of circuits, logic, or processors or parts of processors. The described interleaving techniques may also be implemented in any suitable communications network or communications architecture.

The following numbered clauses provided further example aspects and features of the present technique:

1. A transmitter for transmitting a signal comprising an interleaved symbol stream, the transmitter comprising:
    a convolutional interleaver comprising a plurality of delay portions each of which is arranged to delay symbols from an uninterleaved symbol stream from an input to an output by a different amount, the delay portions being arranged in a sequence;
    an input selector configured to input the symbols from the uninterleaved symbol stream to the delay portions so that successive symbols are input in accordance with the sequence of the delay portions;
    an output selector configured to read the symbols from the delay portions by successively selecting the symbols from the outputs of the delay portions in accordance with the sequence of the delay portions to form an interleaved symbol stream;
    and
    a controller configured
    to detect a discontinuity in the uninterleaved symbol stream;
    to identify symbols from the symbol stream affected by the discontinuity, the identified symbols being symbols which follow the discontinuity in the uninterleaved symbol stream and would be read from the delay portions into the interleaved symbol stream or pushed out from the delay portions in response to the input of symbol from the symbol stream before one or more symbols which precede the discontinuity in the uninterleaved symbol stream are read from the delay portions;
    to store one or more of the identified symbols; and
    to read the identified symbols into the interleaved symbol stream to compensate for the discontinuity, wherein at least one of the identified symbols is stored in one or more memories of a buffer.

2. A transmitter according to clause 1, wherein the symbols are input to and read out from the delay portions in a first direction in accordance with the sequence of delay portions and the controller is configured to determine a reference number ($N_{ref}$) for each symbol output from the delay portions, the reference number identifying the position of each symbol in the uninterleaved symbol stream, and the reference number is calculated in accordance with $$N_{ref} = (N_{iter} - N_{pors} + 1) N_{pors} + (N_{pors} + 1) N_{por}$$

where $N_{por}$ is a position of a delay portion relative to the other delay portions, $N_{pors}$ is the total number of delay portions and $N_{iter}$ represents a number of iterations through the delay portions.

3. A transmitter according to clause 1, wherein the symbols are input to and read out from the delay portions in a second direction in accordance with the sequence of delay portions and the controller is configured to determine a reference number ($N_{ref}$) for each symbol output from the delay portions and the reference number is calculated in accordance with $$N_{ref} = (N_{iter} - N_{por}) N_{pors} + N_{por}$$

where $N_{por}$ is a position of a delay portion relative to the other delay portions, $N_{pors}$ is the total number of delay portions and $N_{iter}$ represents the number of iterations through the delay portions.

4. A transmitter according to clauses 2 or 3, wherein the controller is configured to identify the symbols affected by the discontinuity in accordance with $N_{ref} < 0$.

5. A transmitter according to clauses 2 or 3, wherein the symbols of the uninterleaved symbol stream are divided into interleaving frames and the controller is configured to identify the symbols affected by the discontinuity in accordance with $N_{ref} \geq N_{frame}$ for a symbol where $N_{frame}$ represents the number of symbols remaining in the current interleaving frame.

6. A transmitter according to any of clauses 1 to 5, wherein the symbols of the uninterleaved symbol stream are divided into interleaving frames and the discontinuity is a transition between interleaving frames, and the controller is configured, in response to the all the symbols from the current interleaving frame having been read into the interleaved symbol stream, to read the symbols stored in the buffer into the interleaved symbol stream to form the next interleaving frame.

7. A transmitter according to clause 6, wherein, in response to the reading out the stored symbols from the buffer into the interleaved symbol stream, the controller is configured to store symbols read out by the output selector from the delay portions in the buffer.

8. A transmitter according to clauses 5, 6 or 7, wherein $N_{frame}$ represents the number of symbols remaining in the current interleaving frame and $N_{frame} \bmod N_{pors} = 0$.

9. A transmitter according to any of clauses 1 to 8, wherein the maximum number of symbols stored in the buffer ($N_{max}$) is approximately $$N_{max} = \sum_{k=1}^{floor\left(\frac{N_{pors}}{2}\right)} k$$

where $N_{pors}$ is the number of delay portions.

10. A transmitter according to clause 1, wherein the identified symbols stored in the buffer are symbols pushed out from a delay portion in response to the input of a symbol to the delay portion.

11. A transmitter according to any of clauses 1 to 10, wherein the output selector reads out identified symbols from the delay portions when all symbols which precede the discontinuity in the uninterleaved symbol stream have been read into the interleaved symbol stream.

The invention claimed is:

1. A transmitter for transmitting a signal comprising an interleaved symbol stream, the transmitter comprising:
   a forward error correction encoder configured to encode a stream of data symbols into a plurality of forward error correction encoded frames,
   a convolutional interleaver comprising a plurality of delay portions each of which is arranged to delay symbols from the plurality of forward error correction encoded frames from an input to an output by a different amount of delay, the delay portions being arranged in a sequence;
   an interleaver selector providing an input interleaver selector and an output interleaver selector, configured to input the symbols from the plurality of forward error correction encoded frames to the delay portions so that successive symbols are input in accordance with the sequence of the delay portions;
   the output selector being configured to read the symbols from the delay portions by cyclically selecting the symbols from the outputs of the delay portions in accordance with the sequence of the delay portions to form interleaved forward error correction encoded frames, the input selector being arranged with the output selector so that each of the input and output selectors selects from the same delay portion,
   a frame builder configured to form the interleaved forward error correction frames into a physical layer frame,
   a controller configured
   to generate signalling data for transmission with the physical layer frame, the signalling data providing an indication of a position of the interleaver selector at the start of the physical layer frame, and
   a transmitter configured to transmit the physical layer frame and the signalling data.

2. A transmitter as claimed in claim 1, wherein the signalling data includes an indication of a number of symbols that a deinterleaver in a receiver will read out from the start of the physical layer frame before the start of a forward error correction frame.

3. A transmitter as claimed in claim 1, wherein the input interleaver selector is operable to input symbols into a delay portion and the output interleaver selector is operable to read out symbols from the delay portions, the input and output interleaver selectors being synchronised such that the input interleaver selector inputs to the same delay portion from which the output interleaver selectors read out.

4. A transmitter as claimed in claim 1, wherein the delay portions of the convolutional interleaver comprise a number of rows (Nrows) of delay elements, each of the rows of the delay elements having an increasing number of delay elements, starting at a first row without a delay element and increasing by one delay element for each numbered row, with a final row having a number of delay elements equal to Nrows.

5. A transmitter as claimed in claim 4, wherein the number of delay elements is equal to Nrows*(Nrows−1)/2.

6. A transmitter as claimed in claim 4, wherein the signalling data includes an indication of a number of rows of the convolutional interleaver, including the row without a delay element.

7. A method of transmitting a signal, the method comprising:
   encoding a stream of data symbols into a plurality of forward error correction encoded frames,
   interleaving the plurality of forward error correction encoded frame using a convolutional interleaver, the convolutional interleaver comprising
   a plurality of delay portions each of which is arranged to delay symbols from the plurality of forward error correction encoded frames from an input to an output by a different amount of delay, the delay portions being arranged in a sequence,
   an interleaver selector providing an input selector and an output selector, configured to input the symbols from the plurality of forward error correction encoded frames to the delay portions so that successive symbols are input in accordance with the sequence of the delay portions, the output selector being configured to read the symbols from the delay portions by cyclically selecting the symbols from the outputs of the delay portions in accordance with the sequence of the delay portions to form interleaved forward error correction encoded frames, the input selector being arranged with the output selector so that each of the input and output selectors selects from the same delay portion,
   building the interleaved forward error correction frames into a physical layer frame,
   transmitting the physical layer frame,
   and
   generating signalling data for transmission with the physical layer frame, the signalling data providing an indication of a position of the interleaver selector at the start of the physical layer frame.

8. A method as claimed in claim 7, wherein the generating the signaling data includes generating with the signalling data an indication of a number of symbols that a deinterleaver in a receiver will read out from the start of the physical layer frame before the start of a forward error correction frame.

9. A method as claimed in claim 7, comprising
   synchronisation the input interleaver selector with the output interleaver selector so that the input interleaver selector inputs to the same delay portion from which the output interleaver selectors read out.

10. A method as claimed in claim 7, wherein the delay portions of the convolutional interleaver comprise a number of rows (Nrows) of delay elements, each of the rows of the delay elements having an increasing number of delay elements, starting at a first row without a delay element and increasing by one delay element for each numbered row, with a final row having a number of delay elements equal to Nrows.

11. A method as claimed in claim 10, wherein the number of delay elements is equal to Nrows*(Nrows−1)/2.

12. A method as claimed in claim 10, wherein the signalling data includes an indication of a number of rows of the convolutional interleaver, including the row without a delay element.

* * * * *